(12) United States Patent
Farrugia et al.

(10) Patent No.: US 9,628,123 B2
(45) Date of Patent: Apr. 18, 2017

(54) MITIGATING A PHASE ANOMALY IN AN ANALOGUE-TO-DIGITAL CONVERTER OUTPUT SIGNAL

(71) Applicant: AIRBUS DEFENCE & SPACE LIMITED, Stevenage, Hertfordshire (GB)

(72) Inventors: Lewis Farrugia, Middlesex (GB); Mark Gibson, Letchworth Garden (GB); Ryan Pearson, Hitchin (GB)

(73) Assignee: AIRBUS DEFENCE AND SPACE LIMITED, Stevenage, Hertfordshire (GB)

( * ) Notice: Subject to any disclaimer, the term of this patent is extended or adjusted under 35 U.S.C. 154(b) by 0 days.

(21) Appl. No.: 15/009,789

(22) Filed: Jan. 28, 2016

(65) Prior Publication Data
US 2016/0248461 A1    Aug. 25, 2016

Related U.S. Application Data

(63) Continuation of application No. 14/502,938, filed on Sep. 30, 2014, now abandoned, which is a (Continued)

(30) Foreign Application Priority Data

Mar. 30, 2012    (EP) .................................... 12275035

(51) Int. Cl.
*H03M 1/08* (2006.01)
*H04B 1/10* (2006.01)
*H03M 1/12* (2006.01)

(52) U.S. Cl.
CPC ........ *H04B 1/1027* (2013.01); *H03M 1/0836* (2013.01); *H03M 1/12* (2013.01)

(58) Field of Classification Search
CPC .... H03M 1/0836; H03M 1/06; H03M 1/0619; H03M 1/08; H03M 1/12; H04B 1/10; H04B 1/1027; H04L 27/22; H04L 27/38
See application file for complete search history.

(56) References Cited

U.S. PATENT DOCUMENTS

| 7,266,161 B1 | 9/2007 | Hart et al. |
| 7,336,729 B2 | 2/2008 | Agazzi |

(Continued)

FOREIGN PATENT DOCUMENTS

| JP | 10505471 A | 5/1998 |
| JP | 4365821 B2 | 11/2009 |

(Continued)

OTHER PUBLICATIONS

Zulhakimi Razake et al., "Low Power Noise Detection Circuit Utilizing Switching Activity Mesurement Method," DASIP, 2010 Confernce on, IEEE Oct. 26, 2010 pp. 158-264.

(Continued)

*Primary Examiner* — Betsy Deppe
(74) *Attorney, Agent, or Firm* — FisherBroyles, LLP; Robert Kinberg (57) ABSTRACT

A method and apparatus for mitigating a phase anomaly in an analogue-to-digital converter (ADC) output signal is disclosed. A plurality of codewords output by the ADC are received and information about an estimated level of interference between an output of the ADC and an input of the ADC due to the codeword is obtained for each codeword based on the logic values of bits in the codeword. In-phase (I) and quadrature (Q) corrections are obtained based on the information about the estimated level of interference, and applied to I and Q values obtained from the ADC output signal.

15 Claims, 4 Drawing Sheets

Related U.S. Application Data continuation of application No. PCT/EP2013/056397, filed on Mar. 26, 2013.

(56) References Cited

U.S. PATENT DOCUMENTS

| | | |
|---|---|---|
| 2004/0164889 A1 | 8/2004 | Asami |
| 2004/0233083 A1 | 11/2004 | Temerinac et al. |
| 2006/0077081 A1 | 4/2006 | Bock |
| 2011/0193139 A1 | 8/2011 | Sakata et al. |
| 2012/0170696 A1 | 7/2012 | Taniguchi et al. |
| 2012/0236975 A1 | 9/2012 | Yamagishi |

FOREIGN PATENT DOCUMENTS

| | | |
|---|---|---|
| JP | 11-163826 A | 8/2011 |
| WO | 9602990 A2 | 2/1996 |

OTHER PUBLICATIONS

International Search Report of PCT/EP2013/056397, Dated May 22, 2013.
Written Opinion of PCT/EP2013/056397, Dated May 22, 2013.
Notice of Reasons for Rejection for related Japanese Appln. No. 2015-502302, dated Nov. 8, 2016, and English translation thereof.

MITIGATING A PHASE ANOMALY IN AN ANALOGUE-TO-DIGITAL CONVERTER OUTPUT SIGNAL

CROSS-REFERENCE TO RELATED APPLICATIONS

This application is a continuation of U.S. application Ser. No. 14/502,938, filed Sep. 30, 2014, which was a continuation of International Application No. PCT/EP2013/056397, filed Mar. 26, 2013, claiming priority to European Patent Application No. 12275035.9, filed Mar. 30, 2012, the priority of which is claimed herein.

FIELD OF THE INVENTION

The present invention relates to mitigating a phase anomaly in an analogue-to-digital converter (ADC) output signal. More particularly, the present invention relates to obtaining information about an estimated level of interference between an output of the ADC and an input of the ADC due to each one of a plurality of codewords based on the logic values of bits in the codeword, and correcting I and Q values obtained from the ADC output signal based on the obtained information.

BACKGROUND OF THE INVENTION

Communications satellites which receive analogue signals, for example from a ground-based transmitter or from another satellite, can be arranged to convert the analogue signals into the digital domain for on board processing. The received analogue signal is converted using an analogue-to-digital converter (ADC), which measures the signal level, e.g. voltage or current, at a particular time and outputs a codeword representing the measured signal level. Therefore the digital signal output by the ADC comprises a sequence of codewords representing the variation in the received signal level over time.

Also, in signal processing applications it can be necessary to accurately measure the phase angle of the signal being processed. For example, when quadrature amplitude modulation (QAM) schemes are used, the angular separation between distinct symbols referred to the origin of the constellation decreases as the order of modulation is increased. Therefore accurate phase angle measurement is desirable to ensure that symbols can be reliably distinguished. Errors can be present in the signal as-received, for example as Gaussian noise, or can be introduced by various components before the digital signal processor (DSP). In the case of conversion from an analogue to a digital signal by an ADC, systematic errors can be introduced by the ADC itself. For instance, it is known that ADCs can suffer from integral non-linearity (INL) and differential non-linearity (DNL) effects which reduce the dynamic range for which the ADC can be used.

The invention was made in this context.

SUMMARY OF THE INVENTION

According to the present invention, there is provided a method of mitigating a phase anomaly in an analogue-to-digital converter ADC output signal, the method comprising receiving a plurality of codewords output by the ADC, obtaining for each one of the plurality of codewords information about an estimated level of interference between an output of the ADC and an input of the ADC due to the codeword, based on the logic values of bits in the codeword, obtaining in-phase I and quadrature Q corrections based on the obtained information, and applying the I and Q corrections to I and Q values obtained from the ADC output signal.

Obtaining information about the estimated level of interference for each codeword may comprise obtaining the information based on the Hamming weight of the codeword.

Obtaining information about the estimated level of interference for each codeword may comprise obtaining a weighted digit sum of the codeword by multiplying each bit of the codeword by a predetermined weighting factor for that bit and summing the weighted bits, and obtaining the information about the estimated level of interference based on the weighted digit sum.

Obtaining information about the estimated level of interference for each codeword may further comprise comparing each bit of the codeword to each corresponding bit of the preceding codeword output by the ADC, to determine the number of 0 to 1 bit transitions and the number of 1 to 0 bit transitions with respect to the preceding codeword, and obtaining the information about the estimated level of interference based on the number of 0 to 1 bit transitions, the number of 1 to 0 bit transitions, and the number of bits set to 1 in the current codeword.

Obtaining information about the estimated level of interference for each codeword may further comprise storing digit sum information about the number of bits set to 1 in each one of the plurality of codewords, and obtaining the information about the estimated level of interference due to the current codeword based on the stored digit sum information.

The estimated level of interference for each codeword may comprise a value representing a relative level of interference due to the codeword, such that a plurality of said values obtained for the plurality of codewords defines an estimated interfering signal, wherein the I and Q values may be obtained by scaling and phase-rotating the estimated interfering signal according to a predetermined amplitude scaling parameter and a predetermined phase rotation parameter.

The method may further comprise correlating the ADC output signal to a first reference signal to obtain the I and Q values from the ADC output signal, wherein phase-rotating the estimated interfering signal may comprise generating a second reference signal that is phase-rotated with respect to the first reference signal by an angle determined by the predetermined phase rotation parameter, and correlating the estimated interfering signal to the second reference signal.

The I and Q corrections may be obtained based on the correlation result of correlating the estimated interfering signal to the second reference signal.

According to the present invention, there is further provided apparatus for mitigating a phase anomaly in an analogue-to-digital converter ADC output signal, the apparatus comprising means for receiving a plurality of codewords output by the ADC and obtaining, for each one of the plurality of codewords, information about an estimated level of interference between an output of the ADC and an input of the ADC due to the codeword, based on the logic values of bits in the codeword, means for obtaining in-phase I and quadrature Q corrections based on the obtained information, and means for applying the I and Q corrections to I and Q values obtained from the ADC output signal.

The means for obtaining the information about an estimated level of interference may be a Hamming weight calculator.

The means for obtaining the information about an estimated level of interference may be arranged to obtain, for each codeword, a weighted digit sum of the codeword by multiplying each bit of the codeword by a predetermined weighting factor for that bit and summing the weighted bits, and obtain the information about the estimated level of interference based on the weighted digit sum.

The means for obtaining the information about an estimated level of interference may be further arranged to compare, for each codeword, each bit of the codeword to each corresponding bit of the preceding codeword output by the ADC, to determine the number of 0 to 1 bit transitions and the number of 1 to 0 bit transitions with respect to the preceding codeword, and obtain the information about the estimated level of interference based on the number of 0 to 1 bit transitions, the number of 0 to 1 bit transitions, and the number of bits set to 1 in the current codeword.

The means for obtaining the information about an estimated level of interference may be further arranged to store digit sum information about the number of bits set to 1 in each one of the plurality of codewords, and obtain the information about the estimated level of interference due to the each codeword based on the stored digit sum information.

The information about an estimated level of interference may comprise a value representing a relative level of interference due to the codeword, such that a plurality of said values obtained for the plurality of codewords defines an estimated interfering signal, and the means for obtaining the I and Q corrections may comprise means for scaling and means for phase-rotating the estimated interfering signal according to a predetermined amplitude scaling parameter and a predetermined phase rotation parameter.

The apparatus may comprise a reference signal generator arranged to generate a first reference signal and a second reference signal that is phase-rotated with respect to the first reference signal by an angle determined by the predetermined phase rotation parameter, and a first correlator arranged to correlate the ADC output signal to the first reference signal to obtain the I and Q values from the ADC output signal, wherein the means for scaling and phase-rotating the estimated interfering signal may include a second correlator arranged to correlate the estimated interfering signal to the second reference signal, to apply the phase rotation to the estimated interfering signal.

BRIEF DESCRIPTION OF THE DRAWINGS

Embodiments of the present invention will now be described, by way of example only, with reference to the accompanying drawings, in which.

DETAILED DESCRIPTION

Figure 1:
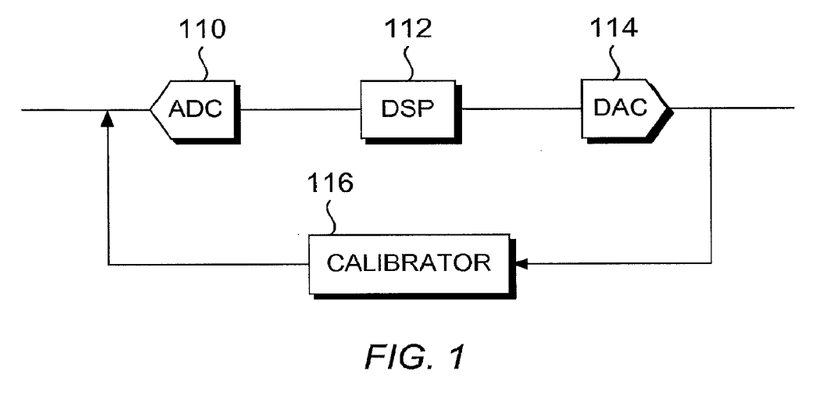
FIG. 1 illustrates a signal processing system for use in a communications satellite.

Referring now to FIG. 1, a signal processing system for use in a communications satellite is illustrated. The system comprises an ADC 110, a DSP 112 connected to the output of the ADC 110, and a digital-to-analogue converter (DAC) 114 connected to the output of the DSP 112. An analogue signal is input to the ADC 110 and converted to a digital signal, which is then processed by the DSP 112. The processed digital signal is then converted back into the analogue domain by the DAC 114.

As shown in FIG. 1, in the present embodiment a DSP calibrator 116 is used to check whether the signal phase is correctly preserved through the transitions from analogue to digital and back to analogue. The DSP calibrator 116 operates by injecting a known reference signal to the ADC 110 input, at a frequency chosen so as not to interfere with other frequencies present in the input signal being processed. The DSP calibrator 116 re-converts the analogue output of the DAC 114 back to a digital representation using its own ADC, i.e. a further ADC included in the calibrator 116, and then correlates this signal with its own local digital I, Q digital reference signals, from which a phase angle is measured. The phase-angle measurement leads to a phase-delay by systematic inference, given the known frequency of the reference signals. Therefore the DSP calibrator 116 can compare the reference signal at the DAC 114 output to the input reference signal to determine whether the reference signal phase has been preserved or whether phase errors have been introduced.

Figure 2:
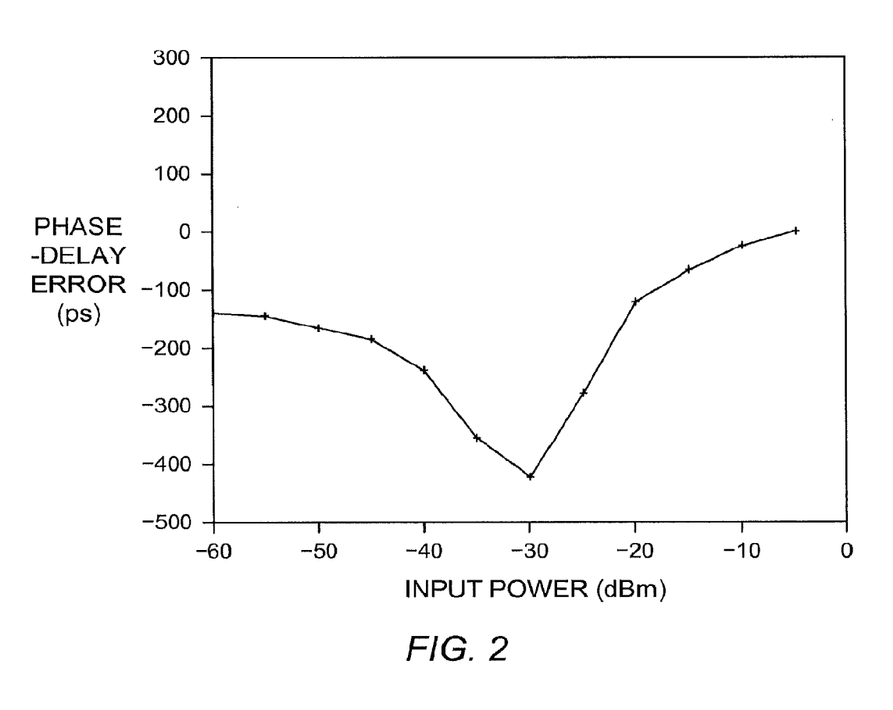
FIG. 2 is a graph plotting phase-delay error against input signal power for the system of FIG. 1.

FIG. 2 is a graph plotting phase-delay error against input signal power for the system of FIG. 1. The phase-delay error is measured in picoseconds (ps) and the input signal power is measured in decibels referenced to one milliwatt (dBm). The phase-delay error is the error inherent in measurements obtained by the DSP calibrator 116 for a reference signal comprising a constant tone at 9.80 megahertz (MHz). As shown in FIG. 2, at low input signal powers phase-delay errors of as much as several hundred ps are inferred as a result of the phase being incorrectly measured by the correlator, with the result that the phase angle is incorrectly measured by the correlator in the DSP calibrator 116. Investigations by the inventors have revealed that the source of this phase-delay anomaly at low signal powers is digital-to-analogue interference between the ADC output and the ADC input in the calibrator 116. Specifically, different output codewords can interfere differently with the input analogue signal, depending on the voltage levels in each codeword.

Figure 3:
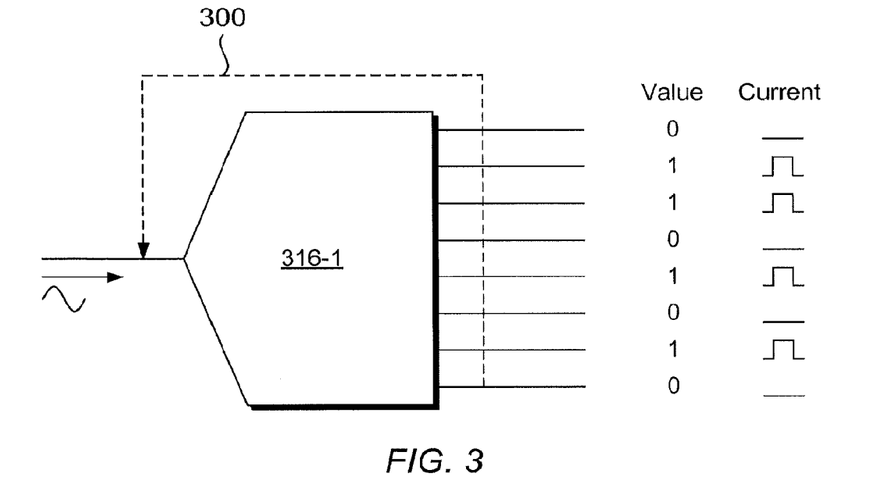
FIG. 3 illustrates digital-to-analogue interference in the output signal of an ADC.

Digital-to-analogue interference in the ADC 316-1 of the DSP calibrator 116 of FIG. 1 is illustrated schematically in FIG. 3. A leakage path 300 exists between the ADC output bus and the ADC input, meaning that the input signal can be influenced by current levels in the codeword presently being output by the ADC 316-1. Such a leakage path may be present in any conventional ADC since in practice the input and output are not perfectly isolated, meaning that a phase-delay anomaly may still occur regardless of the type of ADC used in the calibrator 116.

In more detail, as shown in FIG. 3 the ADC output bus includes a plurality of signal lines each arranged to carry one bit of the output codeword. In the present example the ADC 316-1 is an 8-bit ADC, but the present invention is generally applicable to ADCs of any resolution. As the operating principles of ADCs are well-known, a detailed description will not be provided here. As shown in FIG. 3, the level of current on each of the output lines depends on whether that bit of the codeword presently being output is set to 0 or 1, i.e. whether the voltage is set to low or high. Specifically, when the voltage of a bit is set to high, representing a binary value of 1, a higher current flows in the signal line carrying that bit than in a signal line carrying a binary value of 0. The highest output current will be obtained when all bits of the output codeword are set to 1, and the lowest output current will be obtained when all bits of the output codeword are set to 0. Therefore the strength of the digital-to-analogue interference at any point in time will depend on the number of bits set to 1 in the codeword currently being output by the ADC 316-1. That is, the interference will be stronger when more bits are set to 1 because the mean output current will be higher.

The skilled person will understand that although the exemplary current levels shown in FIG. 3 correspond to one particular electrical protocol, in which a high voltage level represents a value of 1 and a low voltage level represents a value of 0, the present invention is not limited to use with such protocols. In other embodiments other electrical protocols may be used, for instance the level of current in both the 1 and 0 states may be the same, with only the current direction changing. In any case, regardless of the particular protocol used it may be assumed that the level of interference varies according to the logic values of bits in the codeword, e.g. the number of bits set to 1, and/or the number of 1-to-0 and 0-to-1 transitions relative to the preceding codeword, i.e. the difference between logic values of bits in the current codeword and the logic values of corresponding bits in the preceding codeword. In general terms, embodiments of the present invention can estimate the level of interference due to a codeword based on logic values of bits in the codeword.

Figure 4:
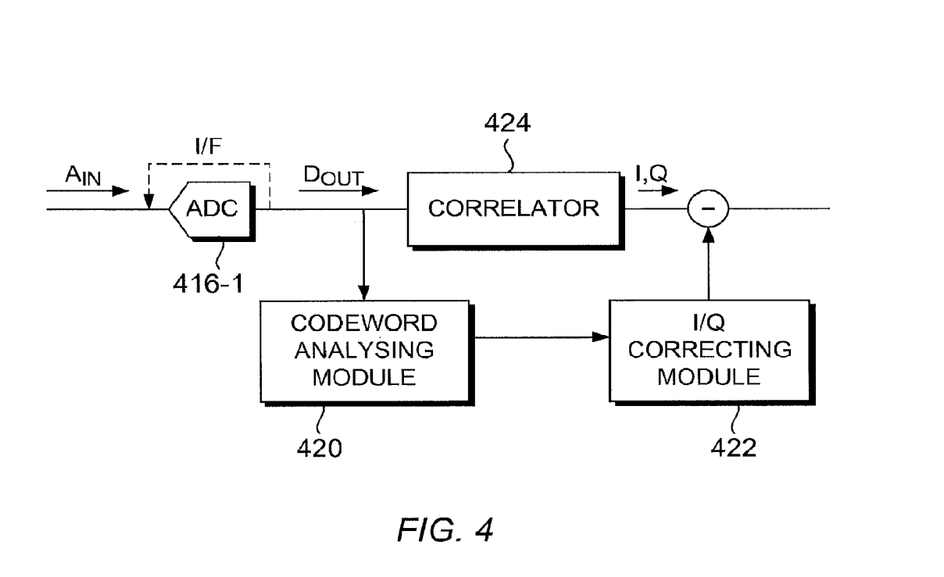
FIG. 4 illustrates apparatus for mitigating a phase anomaly in the output signal of an ADC, according to an embodiment of the present invention.

Referring now to FIG. 4 an apparatus for mitigating a phase anomaly in the output signal of an ADC is illustrated, according to an embodiment of the present invention. The apparatus comprises a codeword analysing module 420 for analysing a codeword output by an ADC 416-1, a correlator 424 for obtaining I and Q values from the ADC output signal, and an I/Q correcting module 422 for obtaining in-phase (I) and quadrature (Q) corrections to be applied to the I and Q values obtained from the ADC output signal.

In more detail, the codeword analysing module 420 is arranged to receive a codeword output by the ADC 416-1, and obtain information about an expected level of interference between the ADC output and input due to that codeword. As described above, the level of digital-to-analogue interference caused by a codeword being output by an ADC can be influenced by the mean current in the output signal lines and/or the number of bit transitions between consecutive codewords. In general, the codeword analysing module 420 can be arranged to obtain the information about the expected level of interference based on the logic values of the bits in the codeword. For example, it may be determined during testing that for a particular type of ADC, the level of interference is strongly influenced by the mean current, which itself is dependent on the number of bits set to 1 in the codeword. Therefore in this case the codeword analysing module 420 can be arranged to obtain information about the number of bits set to 1 in the received codeword. Here, the information about the number of bits set to 1 can take various forms. For instance, in one embodiment the information may simply be the total number of bits set to 1, i.e. the Hamming weight of the codeword. The Hamming weight is the digit sum of a binary number, and can also be referred to as the "population count" or the "sideways sum". For example, the Hamming weight of an 8-bit binary number can be any integer between 0 (i.e. all bits set to 0) and 8 (i.e. all bits set to 1). In the example of FIG. 3, the output codeword 01101010 has a Hamming weight of 4 (0+1+1+0+1+0+1+0).

In other embodiments other approaches may be used. For example, instead of using the Hamming weight, the codeword analysing module 420 can be arranged to obtain a weighted digit sum of the received codeword, by multiplying each bit value (i.e. 1 or 0) by a corresponding predetermined weighting factor for that bit, and summing the weighted bits. This method can take into account the fact that not all output signal lines of the ADC may interfere equally with the ADC input. For example, the coupling between any given signal line and the input may be influenced by the physical layout of the traces within the ADC. Bits transmitted on lines which interfere more strongly can be given a higher weighting than bits transmitted on lines which interfere less strongly. The weighting factors may differ for different ADC designs, and can be determined during setup and calibration of the system.

By estimating the level of interference based on the number of bits set to 1, for example based on the Hamming weight or a weighted digit sum, the apparatus can account for digital-to-analogue interference due to static effects, specifically the ADC bus currents. Depending on the ADC design, in some cases the interference may also be influenced by dynamic effects such as ADC bus transitions, i.e. whether a particular bit changes from 1 to 0 or from 0 to 1 in consecutive codewords. To account for these dynamic effects, in some embodiments the codeword analyser 420 can be arranged to compare each bit of the codeword to each corresponding bit of the preceding codeword output by the ADC, to determine the number of 0 to 1 bit transitions and the number of 1 to 0 bit transitions with respect to the preceding codeword. The information about the expected level of interference can then be obtained based on the number of transitions as well as the number of bits set to 1 in the current codeword. Furthermore, in some embodiments a weighted sum of the number of transitions can be computed, similar to the weighted digit sum of the codeword. This can account for the fact that transitions on a particular line of the ADC bus may interfere more strongly with the ADC input than transitions on another line of the ADC bus.

In yet another embodiment, information can be stored about the number of bits set to 1 for each one of a sequence of codewords output by the ADC. The codeword analyser 420 can then use this stored information, for example to calculate a derivative of the Hamming weight or weighted digit sum with respect to time, e.g. a first-order or second-order derivative. The derivative can be taken into account when estimating the level of interference, to account for higher-order effects. In some embodiments, instead of directly calculating the derivate the first, second, third etc. difference may be used as a numerical approximation to the first, second, third etc. derivative. Here, the finite difference is used as an approximation to the true mathematical derivative because the variable in question, e.g. the Hamming weight or weighted digit sum, is not a continuous variable but instead changes discontinuously between a limited number of discrete values.

To estimate the level of interference and obtain the I and Q corrections, various solutions are possible. One exemplary solution will now be described in detail with reference to FIG. 5, which illustrates an apparatus for mitigating a phase anomaly in the output signal of an ADC, according to an embodiment of the present invention.

Figure 5:
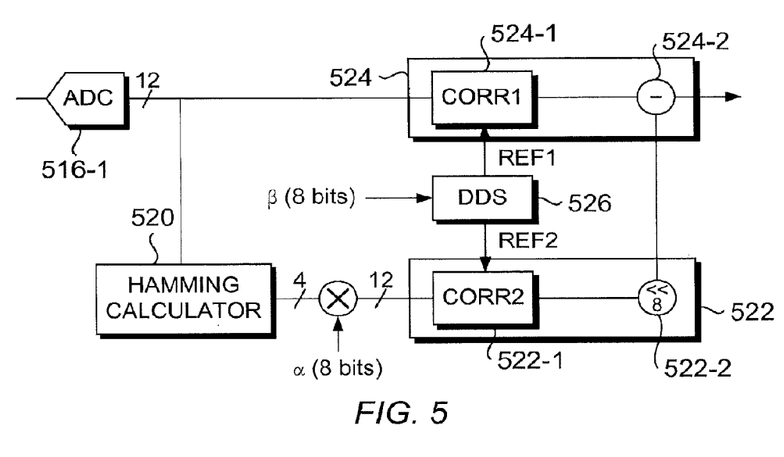
FIG. 5 illustrates an apparatus for mitigating a phase anomaly in a system for measuring the phase angle, according to an embodiment of the present invention.

In essence, the approach taken in FIG. 5 is to estimate the phase and amplitude of a digital-to-analogue interfering signal. This is done by setting the signal level at any point in time based on logic values of the bits in the current codeword, for example the Hamming weight, weighted digit sum, and/or the number of 1-to-0 and 0-to-1 bit transitions relative to the preceding codeword. In the present embodiment, the Hamming weight is used, and a Hamming weight calculating module 520 is provided to calculate the Hamming weight of a digital signal output by an ADC 516-1. As shown in FIG. 5, the ADC 516-1 in the present embodiment is a 12-bit ADC. The Hamming weight of a 12-bit codeword can take an integer value between 0 and 12, and as such the Hamming weight calculating module 520 is provided with a 4-bit output bus to transmit any value between 0 and 12 in binary form.

The output of the Hamming weight calculating module 520 is, in essence, used as a normalised representation of the level of interference due to that particular codeword with respect to other codewords. The output of the Hamming weight calculating module 520 over an extended period, during which a plurality of codewords are output and processed, can be considered as providing a model of the estimated interfering signal, in which the signal level of the estimated interfering signal at any time is given by the Hamming weight of the current codeword. The estimated interfering signal, i.e. the output of the Hamming weight calculating module 520, is then scaled in amplitude to provide a quantified indication of the level of interference between the ADC output and input due to the current codeword. To achieve this, the output of the Hamming weight calculating module 520 is multiplied by a predetermined amplitude scaling parameter $\alpha$. In the present embodiment, $\alpha$ is provided as an 8-bit number, such that a 12-bit scaled estimated interfering signal is obtained.

Next, the scaled signal is sent to a second correlator 522, which is similar to a first correlator 524 used to obtain I and Q values of the original (i.e. uncorrected) digital signal output by the ADC 516-1. Here, a constant phase rotation is applied to the scaled signal to account for the fact that the codeword interfering with the analogue input signal corresponds to an earlier value of the signal, as opposed to the present value of the input signal. This arises because there is a latency associated with the analogue to digital conversion in the ADC 516-1, which for example may include a sample-and-hold circuit and pipeline.

In more detail, the phase-rotation can be applied directly to the scaled signal, or can be applied indirectly by correlating the scaled signal with a phase-rotated reference signal. These two methods are mathematically equivalent, but the latter option is preferred in the present embodiment since the second correlator 522 can also be used to obtain the I and Q corrections. Therefore in the present embodiment, the phase rotation is applied by generating two reference signals with a phase difference of $\beta$, and providing each reference signal to a different one of the correlators 522, 524. Specifically, the value of $\beta$, which in the present embodiment is an 8-bit number, is input to a reference signal generator 526. The reference signal generator 526 generates a first reference signal (REF1) to be sent to the first correlator 524, and a second reference signal (REF2) to be sent to the second correlator 522. In the present embodiment, REF1 is generated based on the equation:

$$REF1(t) = e^{i\omega t}$$

whilst REF2 is generated based on the equation:

$$REF2(t) = e^{i(\omega t + \beta)}$$

where $\beta$ is a predetermined phase rotation parameter. These are merely exemplary, and in other embodiments other approaches may be used to generate reference signals with the necessary phase difference.

The values of $\alpha$ and $\beta$ can be determined empirically during calibration of the system, by testing different values to determine which gives the most effective reduction in the phase-delay anomaly. Accordingly, knowledge of the actual interference mechanism or internal structure of the ADC 516-1 is not required. The parameter optimisation of $\alpha$ and $\beta$ can therefore be obtained offline, i.e. before the system is put into use, and thereafter can be assumed to be time-invariant. In some embodiments however, means can be provided to periodically perform recalibration to update the vales of $\alpha$ and $\beta$, in order to account for effects such as ageing of system components. Also, in the present embodiment it has been assumed that integral non-linearity (INL) and differential non-linearity (DNL) of the ADC 516-1 can be disregarded, but in some embodiments this may not be the case. If INL and DNL effects are not insignificant, $\alpha$ and $\beta$ will be amplitude-dependent. This could be accounted for by determining different values of $\alpha$ and $\beta$ to be used for different amplitudes.

After applying the rotation, a quantified estimate of the level of interference currently present in the ADC output signal is obtained. Also, as a result of the correlation, in-phase (I) and quadrature (Q) values of the estimated interfering signal are obtained. These I and Q values can be used as corrections to be applied to the I and Q values of the output signal, which are obtained by the first correlator 524. Therefore the phase noise in the output signal can be reduced by subtracting the obtained I and Q corrections from the original I and Q values of the ADC output signal.

As shown in FIG. 5, in the present embodiment the second correlator 522 includes a correlation part 522-1 for performing the correlation with the second reference signal REF2, and a bit shifting part 522-2 for performing a bit shift scaling function on the correlation result. The bit shifting part 522-2 is arranged to deal with the accumulated results of the correlating part 522-1, and hence operates at a slower rate than the correlating part 522-1. The bit shifting part 522-2 performs a bit shift scaling function to compensate for the bit-growth after the multiplication by $\alpha$. Similarly, the first correlator 524 includes a correlation part 524-1 and a subtraction part 524-2, the subtraction part being arranged to operate at the same slower rate as the bit shifting part 522-2 of the second correlator 522. In the present embodiment both correlating parts 522-1, 524-1 operate at 48 MHz and the bit shifting part 522-2 and subtracting part 524-2 operate at 10 MHz, but these frequencies are only exemplary and other frequencies may be used.

Figure 6:
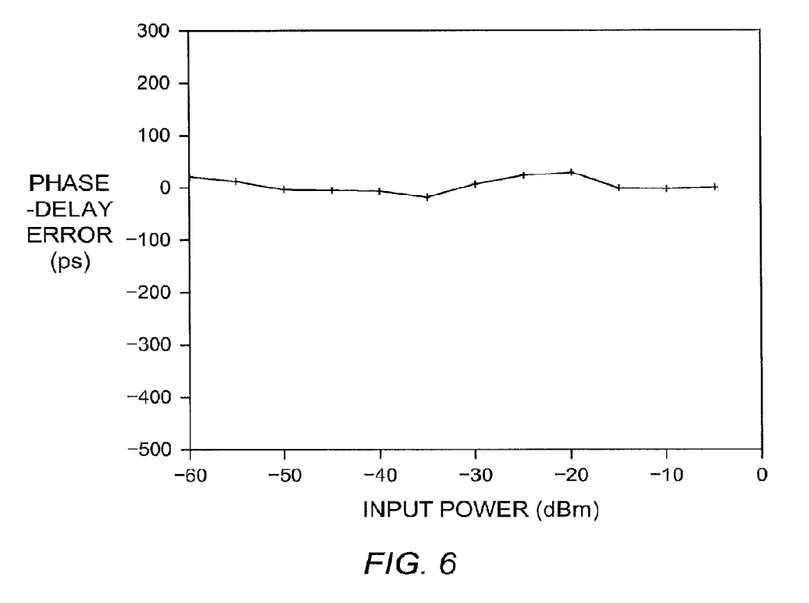
FIG. 6 is a graph plotting phase-delay error against input signal power for the system of FIG. 5.

FIG. 6 is a graph plotting phase-delay error against input signal power for the system of FIG. 5, in which the phase anomaly due to digital-to-analogue interference has been reduced. As in FIG. 2, in FIG. 6 the phase-delay error is measured in picoseconds (ps) and the input signal power is measured in decibels referenced to one milliwatt (dBm). The phase-delay error measurements are obtained for a reference signal comprising a constant tone at 9.80 megahertz (MHz). By comparison with FIG. 2, it can be seen that the system of FIG. 5 is able to substantially reduce the phase-delay error even at low input signal powers.

Figure 7:
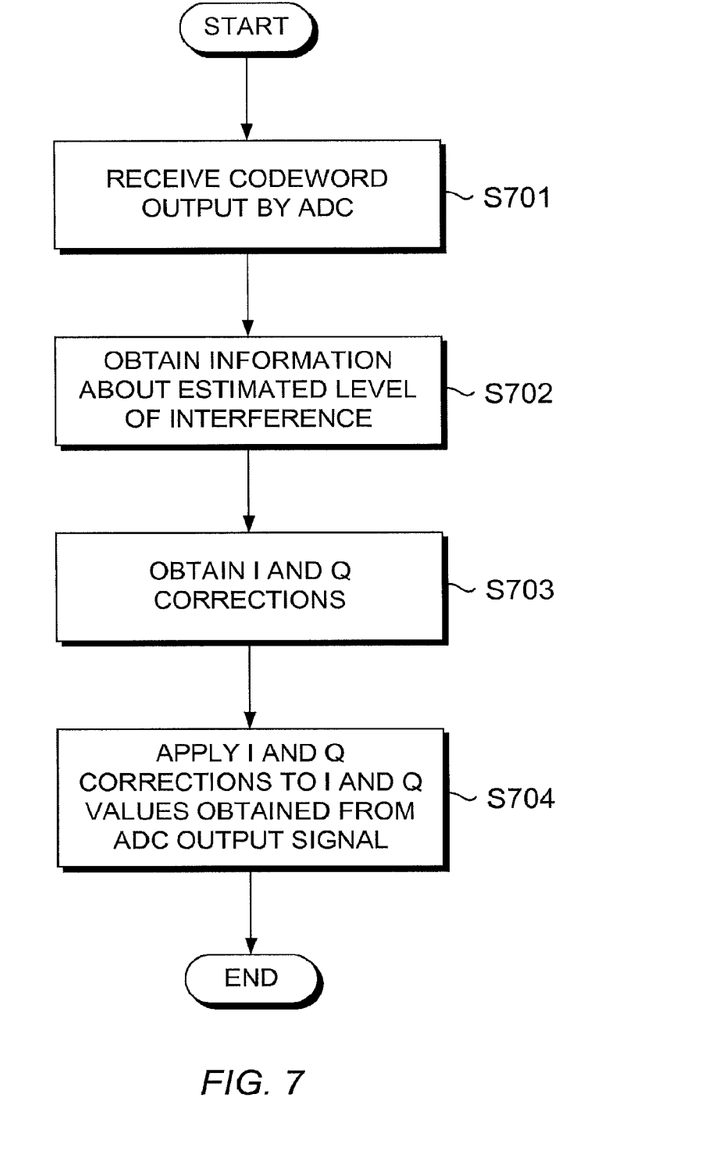
FIG. 7 illustrates a method for mitigating a phase anomaly in an ADC output signal, according to an embodiment of the present invention.

Referring now to FIG. 7, a method for mitigating a phase anomaly in an ADC output signal is illustrated, according to an embodiment of the present invention. In step S701, a codeword output by an ADC is received. Then, in step S702, information about an estimated level of interference between the ADC output and input due to the codeword is obtained, based on the logic values of bits in the codeword. Here, various approaches are possible, as described above. For instance, the information may simply be the Hamming weight of the codeword or could be a weighted digit sum, and could also take into account such factors as bit transitions from one codeword to the next.

Then, in step S703, I and Q are obtained corrections based on the obtained information. For example, a Hamming weight signal can be correlated with a reference signal as described above with reference to FIG. 5. Finally, in step S704, the obtained corrections are applied to I and Q values obtained from the ADC output signal, to mitigate the phase anomaly arising due to digital-to-analogue interference in the ADC.

Although the present invention has been described in relation to phase angle measurement, the skilled person will appreciate that embodiments of the present invention may in general find use in any digital signal processing application where it is desirable to mitigate the effect of the phase anomaly that arises due to digital-to-analogue interference in an ADC.

Whilst certain embodiments of the present invention have been described above, the skilled person will understand that many variations and modifications are possible without departing from the scope of the invention as defined in the accompanying claims.

The invention claimed is:

1. A method of mitigating a phase anomaly in an analogue-to-digital converter ADC output signal, the method comprising:
   receiving a plurality of codewords output by the ADC;
   obtaining, for each one of the plurality of codewords, information about an estimated level of interference between an output of the ADC and an input of the ADC due to the codeword based on the logic values of bits in the codeword;
   obtaining in-phase I and quadrature Q corrections based on the obtained information; and
   applying the I and Q corrections to I and Q values obtained from the ADC output signal.

2. The method of claim 1, wherein obtaining information about the estimated level of interference for each codeword comprises obtaining the information based on the Hamming weight of the codeword.

3. The method of claim 1, wherein obtaining information about the estimated level of interference for each codeword comprises:
   obtaining a weighted digit sum of the codeword by multiplying each bit of the codeword by a predetermined weighting factor for that bit and summing the weighted bits; and
   obtaining the information about the estimated level of interference based on the weighted digit sum.

4. The method of claim 1, wherein obtaining information about the estimated level of interference for each codeword further comprises:
   comparing each bit of the codeword to each corresponding bit of the preceding codeword output by the ADC, to determine the number of 0 to 1 bit transitions and the number of 1 to 0 bit transitions with respect to the preceding codeword; and
   obtaining the information about the estimated level of interference based on the number of 0 to 1 bit transitions, the number of 1 to 0 bit transitions, and the number of bits set to 1 in the current codeword.

5. The method of claim 1, wherein obtaining information about the estimated level of interference for each codeword further comprises:
   storing digit sum information about the number of bits set to 1 in each one of the plurality of codewords; and
   obtaining the information about the estimated level of interference due to the current codeword based on the stored digit sum information.

6. The method of claim 1, wherein the information about the estimated level of interference for each codeword comprises a value representing a relative level of interference due to the codeword, and an estimated interfering signal comprises a plurality of said values obtained for the plurality of codewords
   wherein the I and Q corrections are obtained by sequentially scaling and phase-rotating the estimated interfering signal according to a predetermined amplitude scaling parameter and a predetermined phase rotation parameter.

7. The method of claim 6, further comprising:
   correlating the ADC output signal with a first reference signal to obtain the I and Q values from the ADC output signal,
   wherein phase-rotating the estimated interfering signal comprises generating a second reference signal that is phase-rotated with respect to the first reference signal by an angle determined by the predetermined phase rotation parameter, and correlating the estimated interfering signal with the second reference signal.

8. The method of claim 7, wherein the I and Q corrections are obtained based on the correlation result of correlating the estimated interfering signal with the second reference signal.

9. Apparatus for mitigating a phase anomaly in an analogue-to-digital converter ADC output signal, the apparatus comprising:
   means for receiving a plurality of codewords output by the ADC and obtaining, for each one of the plurality of codewords, information about an estimated level of interference between an output of the ADC and an input of the ADC due to the codeword, based on the logic values of bits in the codeword;
   means for obtaining in-phase I and quadrature Q corrections based on the obtained information; and
   means for applying the I and Q corrections to I and Q values obtained from the ADC output signal.

10. The apparatus of claim 9, wherein the means for obtaining the information about an estimated level of interference is a Hamming weight calculator.

11. The apparatus of claim 9, wherein the means for obtaining the information about an estimated level of interference is arranged to obtain, for each codeword, a weighted digit sum of the codeword by multiplying each bit of the codeword by a predetermined weighting factor for that bit and summing the weighted bits, and obtain the information about the estimated level of interference based on the weighted digit sum.

12. The apparatus of claim 9, wherein the means for obtaining the information about an estimated level of interference is further arranged to: compare, for each codeword, each bit of the codeword to each corresponding bit of the preceding codeword output by the ADC, to determine the number of 0 to 1 bit transitions and the number of 1 to 0 bit transitions with respect to the preceding codeword, and obtain the information about the estimated level of interference based on the number of 0 to 1 bit transitions, the number of 0 to 1 bit transitions, and the number of bits set to 1 in the current codeword.

13. The apparatus of claim 9, wherein the means for obtaining the information about an estimated level of interference is further arranged to store digit sum information about the number of bits set to 1 in each one of the plurality of codewords, and obtain the information about the estimated level of interference for each codeword based on the stored digit sum information.

14. The apparatus of claim 9, wherein;
the information about an estimated level of interference comprises a value representing a relative level of interference due to the codeword, and an estimated interfering signal comprises a plurality of said values obtained for the plurality of codewords,
the means for obtaining the I and Q corrections comprises means for scaling and means for phase-rotating the estimated interfering signal according to a predetermined amplitude scaling parameter and a predetermined phase rotation parameter, respectively, and
the means for scaling and means for phase-rotating operate sequentially on the estimated interfering signal.

15. The apparatus of claim 14, comprising:
a reference signal generator arranged to generate a first reference signal and a second reference signal that is phase-rotated with respect to the first reference signal by an angle determined by the predetermined phase rotation parameter; and
a first correlator arranged to correlate the ADC output signal with the first reference signal to obtain the I and Q values of the ADC output signal;
wherein the means for phase-rotating the estimated interfering signal includes a second correlator arranged to correlate the estimated interfering signal to the second reference signal, to apply the predetermined phase rotation to the estimated interfering signal.

* * * * *